United States Patent
Miyazaki

(12) 
(10) Patent No.: US 6,709,884 B2
(45) Date of Patent: Mar. 23, 2004

(54) LIGHT EMITTING DEVICE, SEMICONDUCTOR DEVICE, AND METHOD OF MANUFACTURING THE DEVICES

(75) Inventor: Koichi Miyazaki, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/225,318

(22) Filed: Aug. 21, 2002

(65) Prior Publication Data

US 2002/0195608 A1 Dec. 26, 2002

Related U.S. Application Data

(62) Division of application No. 09/934,058, filed on Aug. 21, 2001.

(30) Foreign Application Priority Data

Aug. 21, 2002 (JP) .................................. P2000-249587

(51) Int. Cl.$^7$ .............................................. H01L 21/00
(52) U.S. Cl. .......................................... 438/47; 438/39
(58) Field of Search ........................... 438/29, 39, 47; 257/79

(56) References Cited

U.S. PATENT DOCUMENTS

| | | | | |
|---|---|---|---|---|
| 6,278,136 B1 | * | 8/2001 | Nitta ........................... | 257/99 |
| 6,399,407 B1 | * | 6/2002 | O'Brien et al. ............... | 438/29 |
| 6,403,983 B1 | * | 6/2002 | Mizuno ........................ | 257/79 |
| 6,416,886 B1 | * | 7/2002 | Gyoutoku et al. .......... | 428/690 |
| 6,417,522 B1 | * | 7/2002 | Wang et al. ................. | 257/79 |
| 6,417,525 B1 | * | 7/2002 | Hata ........................... | 257/91 |
| 2002/0125488 A1 | * | 9/2002 | Hashimoto et al. ........... | 257/79 |

FOREIGN PATENT DOCUMENTS

| | | |
|---|---|---|
| JP | 62283690 | 12/1987 |
| JP | 1196888 | 8/1989 |
| JP | 3194988 | 8/1991 |

OTHER PUBLICATIONS

Silicon Processing, vol. 1, Copyright 1986, pp. 384–385, by S. Wolf and R. N. Tauber.*

* cited by examiner

Primary Examiner—Carl Whitehead, Jr.
Assistant Examiner—William Vesperman
(74) Attorney, Agent, or Firm—Sonnenschein, Nath & Rosenthal LLP

(57) ABSTRACT

The invention provides a light emitting device and a semiconductor device each having improved characteristics by preventing occurrence of a damage caused by contact of a tool. On a substrate, an n-type semiconductor layer, an active layer, and a p-type semiconductor layer are stacked. On the p-type semiconductor layer, a p-side electrode is provided. The p-type semiconductor layer has a projected portion for limiting current in correspondence with a current injection area in the active layer. A projected portion is formed on the surface of the p-side electrode in correspondence with the projected portion for limiting current. On the surface of the p-side electrode, a protective portion is also provided in correspondence with the area other than the current injection area in the active layer. The top face of the protective portion is higher than that of the projected portion. With the configuration, contact of a tool or the like with the projected portion and its periphery can be prevented, so that the projected portion and its periphery such as the projected portion for limiting current and the current injection area in the active layer can be prevented from being damaged.

4 Claims, 16 Drawing Sheets

LIGHT EMITTING DEVICE, SEMICONDUCTOR DEVICE, AND METHOD OF MANUFACTURING THE DEVICES

RELATED APPLICATION DATA

The present application claims priority to Japanese Application No. P2000-249587, filed Aug. 21, 2000, and is a divisional of U.S. application Ser. No. 09/934,058, filed Aug. 21, 2001, both of which are incorporated herein by reference to the extent permitted by law.

BACKGROUND OF THE INVENTION

1. Field of the Invention

The present invention relates to a light emitting device and a semiconductor device in each of which semiconductor layers are stacked on a substrate, and a method of manufacturing the devices.

2. Description of the Related Art

At present, a semiconductor laser (laser diode: LD) is used in various apparatuses such as optical disk drive, laser beam printer, and copying machine. FIG. 1 shows an example of the configuration of a conventional semiconductor laser. In the semiconductor laser, an n-type cladding layer 113, an active layer 114, a first p-type cladding layer 115, an etching stop layer 116, a second p-type cladding layer 117, and a p-side contact layer 118 are sequentially stacked on a substrate 111. By forming the second p-type cladding layer 117 in a strip shape in correspondence with a current injection area in the active layer 114, the current is limited. On the surface opposite to the substrate 111 side, a projected portion 123 is formed in correspondence with the second p-type cladding layer 117.

In the conventional semiconductor laser shown in FIG. 1, however, since the projected portion 123 is formed on the surface in correspondence with the second p-type cladding layer 117, the number of times a tool comes into contact with the projected portion 123 and its peripheral area in a manufacturing process and the like is large. It causes a problem such that the projected portion 123 and its periphery, for example, the second p-type cladding layer 117 and the current injection area in the active layer 114 are vulnerable to damage. For example, in a case such that a semiconductor laser is formed and carried to a measuring device by using an adsorbent tool, despite of examinations of improving the shape of a tool, controlling absorbing power of the tool, and the like, the damage cannot be effectively prevented. Due to this, the characteristics deteriorate.

SUMMARY OF THE INVENTION

The invention has been achieved in consideration of the above problems and its object is to provide a light emitting device and a semiconductor device each having improved characteristics by preventing damage caused by contact of a tool, and a method of manufacturing the devices.

According to an aspect of the invention, there is provided a light emitting device in which semiconductor layers including an active layer are stacked on a substrate, wherein the active layer has a current injection area into which a current is injected, a projected portion is provided in correspondence with the current injection area on the surface opposite to the substrate, a projected protective portion is provided in correspondence with an area other than the current injection area, and the protective portion is projected so that its top face is flush with or higher than that of the projected portion.

According to the invention, there is also provided a light emitting device in which semiconductor layers including an active layer are stacked on a substrate, wherein the active layer has a current injection area into which a current is injected, the semiconductor layer has a projected portion for limiting current in correspondence with the current injection area, a protective portion is provided in correspondence with an area other than the current injection area on the surface opposite to the substrate, and the protective portion is projected so that its top face is flush with or higher than that of the area corresponding to the current injection area, in the surface opposite to the substrate.

According to the invention, there is also provided a semiconductor device in which semiconductor layers are stacked on a substrate, including a projected portion and a projected protective portion having a top face flush with or higher than that of the projected portion on the surface opposite to the substrate.

A method of manufacturing a light emitting device according to the invention includes: a step of growing semiconductor layers including an active layer on a substrate; a step of forming a projected portion for limiting current in correspondence with the current injection area in the active layer in the semiconductor layer, thereby forming a projected portion in correspondence with the projected portion for limiting current on the surface opposite to the substrate; and a step of forming a protective portion projected so that its top face is flush with or higher than that of the projected portion on the surface opposite to the substrate in correspondence an area other than the current injection area in the active layer.

Another method of manufacturing a light emitting device according to the invention includes: a step of growing semiconductor layers including an active layer on a substrate; a step of forming a projected portion for limiting current on the semiconductor layer in correspondence with a current injection area in the active layer; and a step of forming a protective portion on the surface opposite to the substrate in correspondence with the area other than the current injection area in the active layer so that the top face of the protective portion is flush with or higher than that of the area corresponding to the current injection area, in the surface opposite to the substrate.

Further another method of manufacturing a semiconductor device according to the invention includes: a step of growing semiconductor layers on a substrate; and a step of forming a projected portion and a protective portion projected so that its top face is flush with or higher than that of the projected portion on the surface opposite to the substrate.

In each of the light emitting device and the semiconductor device according to the invention, on the surface opposite to the substrate of the device, the projected protective portion of which top face is either flush with or higher than that of the projected portion is provided. Consequently, the number of times a tool comes into contact with the projected portion is reduced, thereby preventing the projected portion and its periphery from being damaged.

In another light emitting device according to the invention, on the surface opposite to the substrate of the device, the protective portion of which top face is either flush with or higher than that of the area in the surface corresponding to the current injection area is provided. Consequently, the number of times a tool comes into contact with the surface corresponding to the current injection area is reduced, thereby preventing the surface corresponding to the current injection area and its periphery from being damaged.

In each of the method of manufacturing the light emitting device and the method of manufacturing the semiconductor device according to the invention, on the surface opposite to the substrate of the device, the projected protective portion of which top face is either flush with or higher than that of the projected portion is formed.

In another method of manufacturing the light emitting device according to the invention, on the surface opposite to the substrate of the device, the protective portion of which top face is either flush with or higher than that of the area in the surface corresponding to the current injection area is formed.

Other and further objects, features and advantages of the invention will appear more fully from the following description.

DETAILED DESCRIPTION OF THE PREFERRED EMBODIMENTS

Embodiments of the invention will be described in detail hereinbelow with reference to the drawings.

[First Embodiment]

Figure 1:
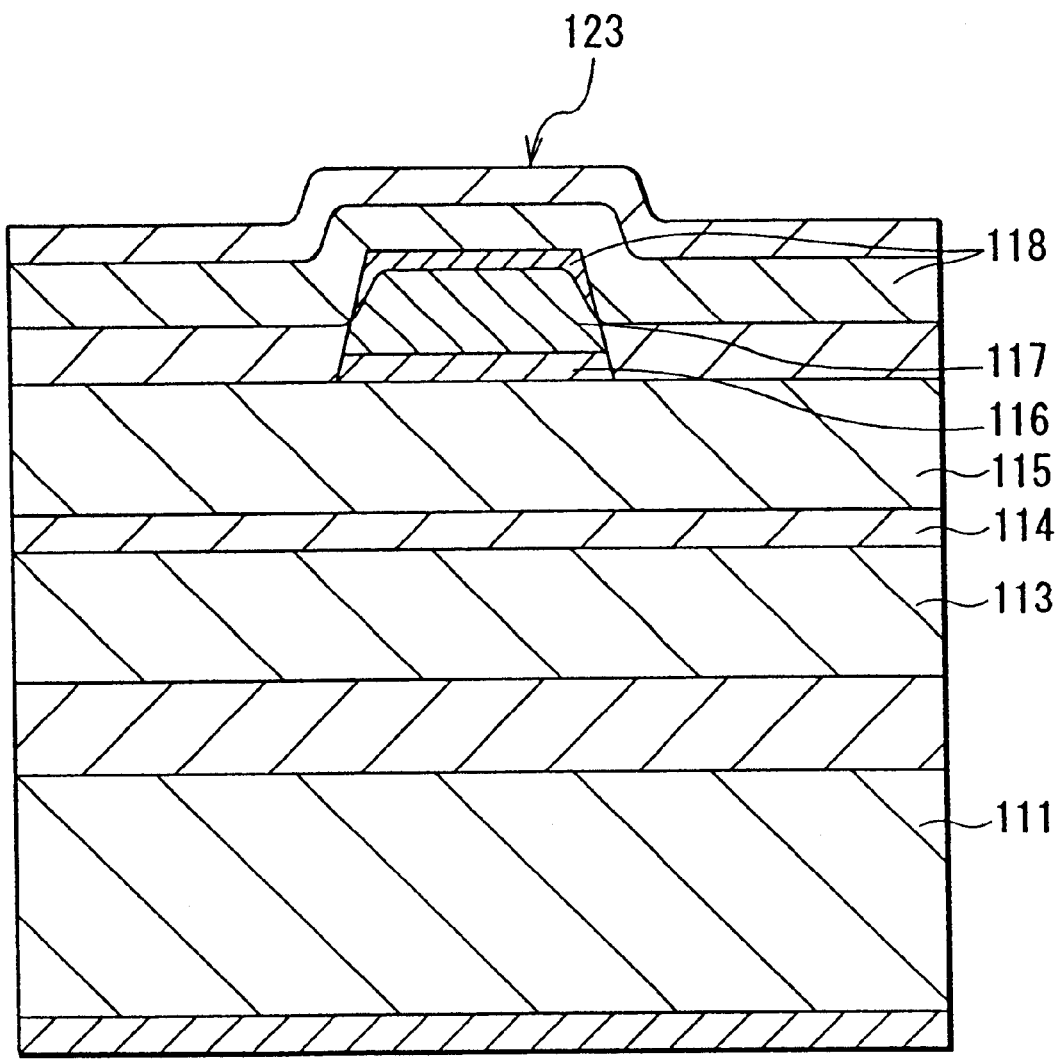
FIG. 1 is a cross section showing the configuration of a conventional semiconductor laser.
Figure 2:
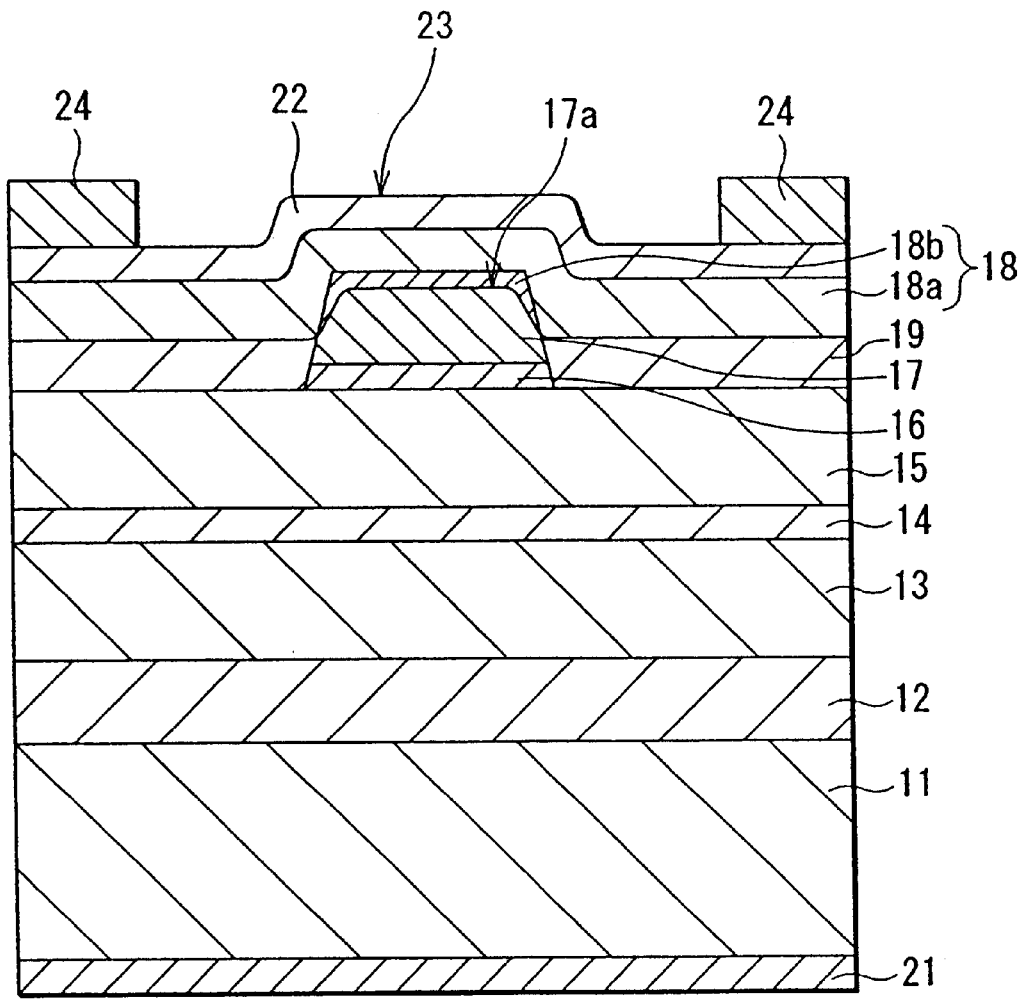
FIG. 2 is a cross section showing the configuration of a semiconductor laser according to a first embodiment of the invention.

FIG. 2 shows the configuration of a semiconductor laser as a light emitting device according to a first embodiment of the invention. In the semiconductor laser, on one face side of a substrate 11, semiconductor layers which are a buffer layer 12, an n-type cladding layer 13, an active layer 14, a first p-type cladding layer 15, an etching stop layer 16, a second p-type cladding layer 17, and p-side contact layer 18 are sequentially stacked in this order. The buffer layer 12 and the n-type cladding layer 13 are n-type semiconductor layers corresponding to semiconductor layers of a first conduction type. The first p-type cladding layer 15, etching stop layer 16, second p-type cladding layer 17, and p-side contact layer 18 are p-type semiconductor layers corresponding to semiconductor layers of a second conduction type.

The substrate 11, for example, has a thickness in the stack direction (hereinbelow, simply called thickness) of 100 $\mu$m and is made of n-type GaAs in which an n-type impurity such as silicon (Si) or selenium (Se) is doped. The buffer layer 12, for example, has a thickness of 1 $\mu$m and is made of n-type $Al_{0.3}Ga_{0.7}As$ mixed crystal in which an n-type impurity such as silicon or selenium is doped. The n-type cladding layer 13, for example, has a thickness of 1 $\mu$m and is made of n-type $Al_{0.47}Ga_{0.53}As$ mixed crystal in which an n-type impurity such as silicon or selenium is doped.

The active layer 14, for example, has a thickness of 80 nm and is made of non-$Al_{0.1}Ga_{0.9}As$ mixed crystal in which no impurity is doped. The active layer 14 has a current injection area into which a current is injected and a non-current injection area other than the current injection area. The current injection area functions as a light emitting area.

The first p-type cladding layer 15, for example, has a thickness of 0.3 $\mu$m and is made of p-type $Al_{0.47}Ga_{0.53}As$ mixed crystal in which a p-type impurity such as zinc (Zn) is doped. The etching stop layer 16, for example, has a thickness of 70 nm and is made of p-type $Al_{0.3}Ga_{0.7}As$ mixed crystal in which a p-type impurity such as zinc is doped. The second p-type cladding layer 17, for example, has a thickness of 1.2 $\mu$m and is made of p-type $Al_{0.47}Ga_{0.53}As$ mixed crystal in which p-type impurity such as zinc is doped.

At least a part of the etching stop layer 16 and the second p-type cladding layer 17 are formed in a narrow strip shape (strip shape elongated in the direction perpendicular to the drawing sheet in FIG. 2), thereby forming a projected portion 17a for limiting current. The projected portion 17a is used to regulate the current injection area in the active layer 14, and the portion corresponding to the projected portion 17a in the active layer 14 is the current injection area. On both sides of the projected portion 17a, a current stop layer 19 having a thickness of 0.5 $\mu$m, made of n-type GaAs in which an n-type impurity such as silicon or selenium is doped is formed in correspondence with the non-current injection area of the active layer 14.

The p-side contact layer 18 is formed by, for example, diffusing a p-type impurity such as zinc and has a first diffusion area 18a made of p-type GaAs and a second diffusion area 18b made of p-type $Al_{0.47}Ga_{0.53}As$ mixed crystal. The second diffusion area 18b is, as will be described in a manufacturing method hereinlater, an area formed by diffusing a p-type impurity into a part of the second p-type cladding layer 17. The thickness of the p-side contact layer 18 is, for example, 1 $\mu$m.

The semiconductor laser has an n-side electrode 21 on the side opposite to the one face of the substrate 11. The n-side electrode 21 has, for instance, a structure in which an alloy layer of gold and germanium (Ge), a nickel (Ni) layer, and a gold (Au) layer are stacked sequentially on the substrate 11 and are alloyed by heat treatment. The n-side electrode 21 is electrically connected to an n-type semiconductor layer via the substrate 11. On the other hand, a p-side electrode 22 is provided on the p-side contact layer 18. The p-side electrode 22 has, for example, a structure in which a titanium (Ti)

layer, a platinum (Pt) layer, and a gold layer are stacked sequentially on the p-side contact layer 18 and are alloyed by heat treatment. The p-side electrode 22 is electrically connected to a p-side semiconductor layer. The p-side electrode 22 corresponds to an example of "electrode" of the invention.

On the surface of the p-side electrode 22, that is, on the surface opposite to the substrate 11 of the semiconductor laser, a projected portion 23 is formed in correspondence with the current injection area in the active layer 14. The projected portion 23 is formed in correspondence with the projected portion 17a from a manufacture viewpoint and has a strip shape elongated in the same direction as that of the projected portion 17a. The p-side electrode 22 serves as the surface of the projected portion 23. The projected portion 23 does not have to perfectly coincide with the current injection area in the active layer 14. For example, as shown in FIG. 2, the projected portion 23 may be provided in an area slightly wider than the current injection area. On the contrary, it may be provided in an area slightly narrower than the current injection area. That is, it may be provided in relation with the current injection area.

On the surface of the p-side electrode 22, that is, on the surface opposite to the substrate 11 of the semiconductor laser, projected protective portions 24 are formed in correspondence with the non-current injection areas in the active layer 14. In the embodiment, for example, the protective portions 24 extend in the same direction as that of the projected portion 23 and are formed on both sides of the projected portion 23. The protective portions 24 are made of, for example, a metal such as gold (Au) or an insulating material such as silicon dioxide ($SiO_2$) or silicon nitride ($Si_3N_4$). The top face of the protective portion 24 is either flush with or higher than that of the projected portion 23, thereby preventing contact of a tool or the like with the projected portion 23. The protective portion 24 does not have to perfectly coincide with the non-current injection area of the active layer 14. For example, as shown in FIG. 2, the protective portion 24 may be provided in a part of an area corresponding to the non-current injection area or in an area slightly wider than the non-current injection area. That is, it may be provided in relation with the non-current injection area.

A pair of side faces facing in the extending direction of the second p-type cladding layer 17, of the semiconductor laser serve as resonator end faces. On the pair of resonator end faces, a pair of not-illustrated reflector films are formed. One of the reflector films is made of, for example, aluminum oxide ($Al_2O_3$) and is adjusted so as to have a low reflectance. The other reflector film is constructed by, for example, alternately stacking an aluminum oxide film and an amorphous silicon layer so as to have a high reflectance. With the configuration, light generated by the active layer 14 is amplified by being reflected between the pair of reflector films and the amplified light is emitted as a laser beam from the reflector film on the low reflectance side.

The semiconductor laser having such a configuration can be manufactured as follows.

Figure 3A:
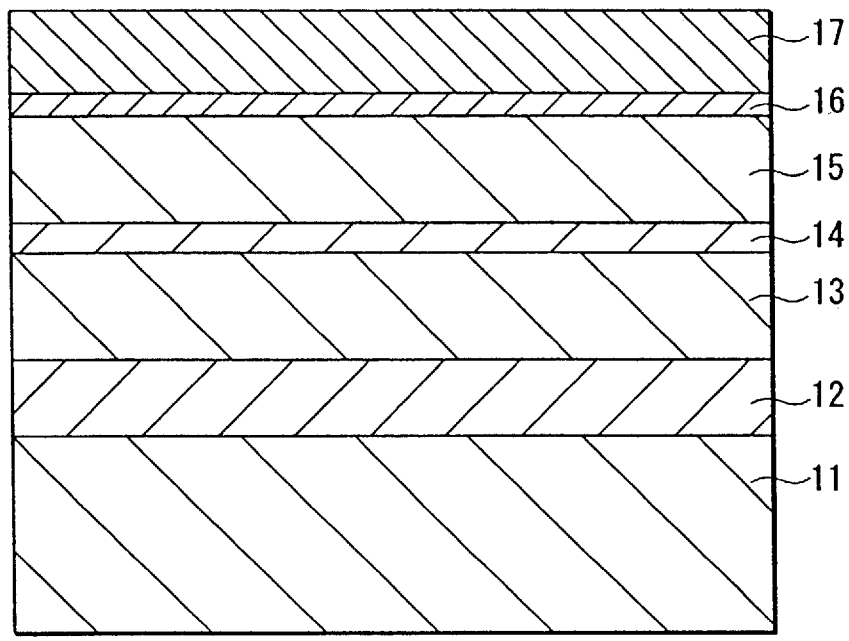
FIGS. 3A and 3B are cross sections showing a process of manufacturing the semiconductor laser illustrated in FIG. 2.

FIGS. 3A and 3B to FIG. 6 show a method of manufacturing the semiconductor laser according to the embodiment in accordance with the order of processes. First, as shown in FIG. 3A, for example, on one face of the substrate 11 made of n-type GaAs having a thickness of 450 $\mu$m, the buffer layer 12 made of n-type $Al_{0.3}Ga_{0.7}As$ mixed crystal, the n-type cladding layer 13 made of n-type $Al_{0.47}Ga_{0.53}As$ mixed crystal, the active layer 14 made of non-$Al_{0.1}Ga_{0.9}As$ mixed crystal, the first p-type cladding layer 15 made of p-type $Al_{0.47}Ga_{0.53}As$ mixed crystal, the etching stop layer 16 made of p-type $Al_{0.3}Ga_{0.7}As$ mixed crystal, and the second p-type cladding layer 17 made of p-type $Al_{0.47}Ga_{0.53}As$ mixed crystal are sequentially grown by MOCVD (Metalorganic Chemical Vapor Deposition).

Figure 3B:
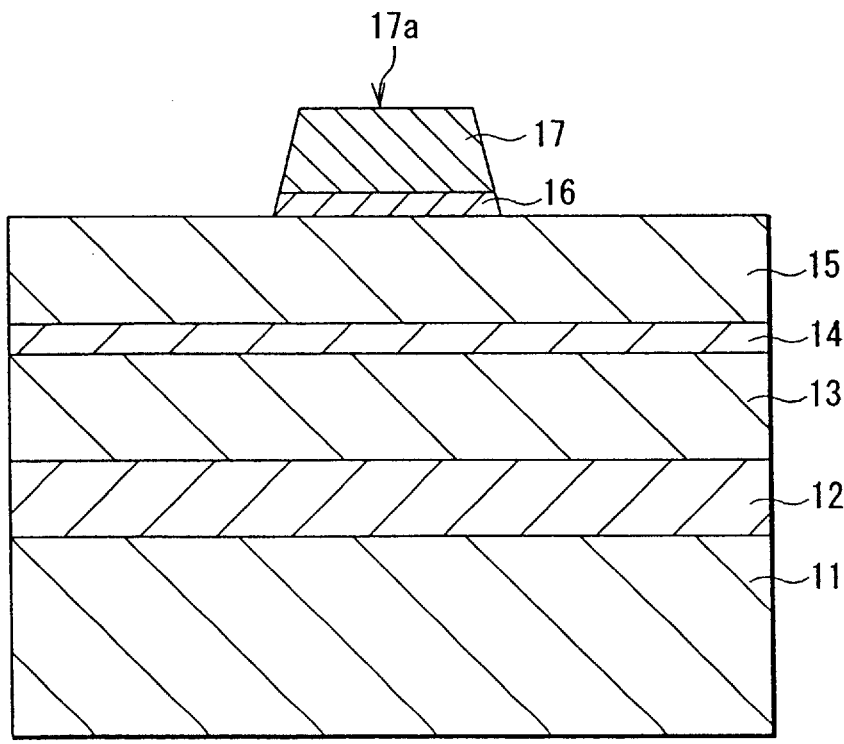

As shown in FIG. 3B, for example, a not-illustrated mask layer is formed on the second p-type cladding layer 17 and the second p-type cladding layer 17 is selectively removed by using the etching stop layer 16 by reactive ion etching (RIE). By the operation, at least a part of the second p-type cladding layer 17 and the etching stop layer 16 are formed in a narrow strip shape in correspondence with the current injection area in the active layer 14, thereby forming the projected portion 17a. After that, the not-illustrated mask layer is removed.

Figure 4A:
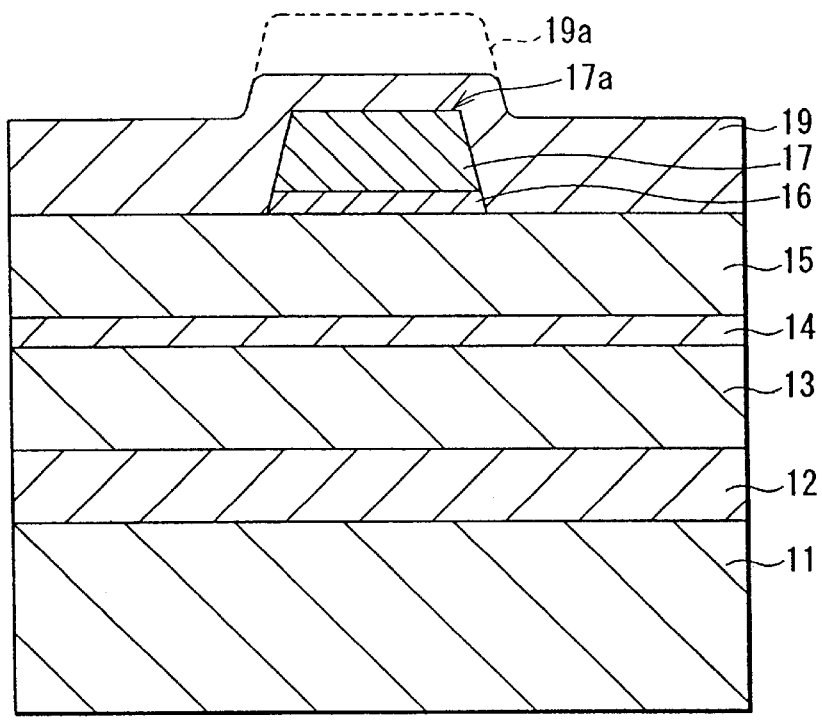
FIGS. 4A and 4B are cross sections showing a manufacturing process continued from FIG. 3B.

As shown in FIG. 4A, for example, on the first p-type cladding layer 15 and the projected portion 17a, the current stop layer 19 made of n-type GaAs is grown by MOCVD. In this case, the thickness of the current stop layer 19 to be grown is set to be a sufficient thickness also including the amount of forming the p-side contact layer 18 by diffusing a p-type impurity in a part of the current stop layer 19 in a process which will be described hereinlater. After that, for example, by using the lithography technique, an upper part 19a of the projected portion corresponding to the projected portion 17a in the grown current stop layer 19 is selectively removed by RIE.

Figure 4B:
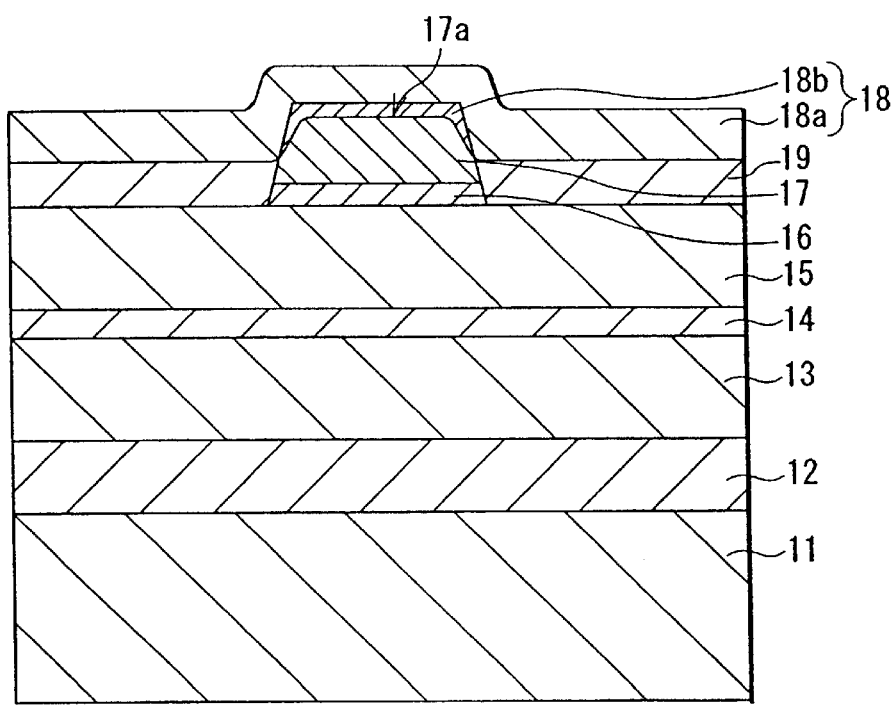

After selectively removing the current stop layer 19, as show in FIG. 4B, for example, a p-type impurity such as zinc is diffused in an upper part of the current stop layer 19 and in an upper part of the second p-type cladding layer 17. A first diffusion area 18a in the p-side contact layer 18 is formed in the upper part of the current stop layer 19 and a second diffusion area 18b of the p-side contact layer 18 is formed in the upper part of the second p-type cladding layer 17.

Figure 5A:
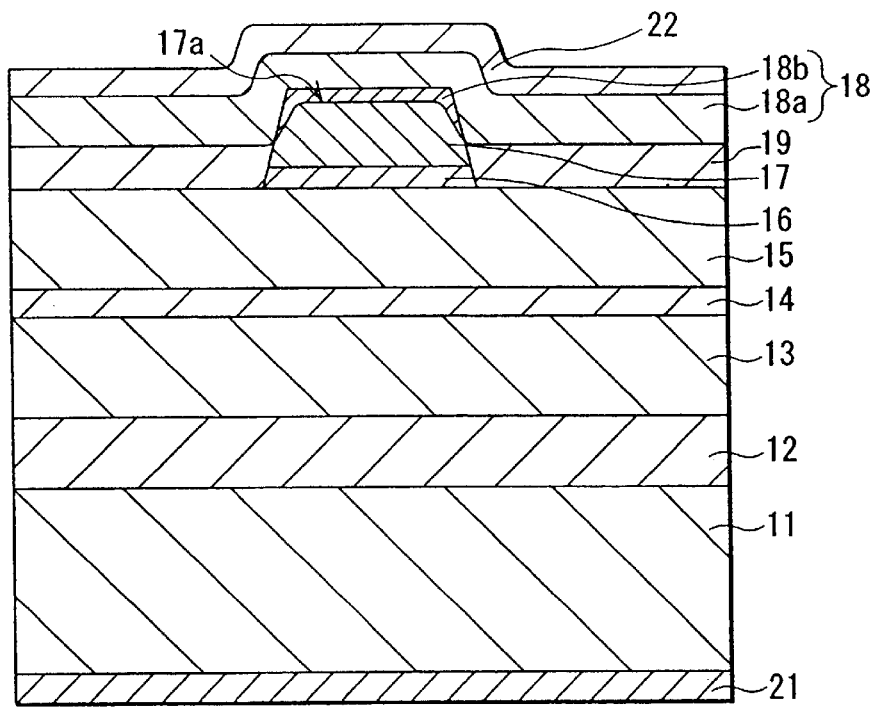
FIGS. 5A and 5B are cross sections showing a manufacturing process continued from FIG. 4B.

After forming the p-side contact layer 18, as shown in FIG. 5A, for example, the other face of the substrate 11 is lapped to adjust the thickness of the substrate 11 to 100 $\mu$m, an alloy layer of gold and germanium, a nickel layer, and a gold layer are sequentially vapor-deposited on the other face and are subjected to heat treatment, thereby forming the n-side electrode 21. On the p-side contact layer 18, for example, a titanium layer, a platinum later, and a gold layer are sequential vapor-deposited and subjected to heat treatment, thereby forming the p-side electrode 22. Since the projected portion is formed on the surface of the p-side contact layer 18 in correspondence with the projected portion 17a, also on the surface of the p-side electrode 22, the projected portion 23 is formed in correspondence with the projected portion 17a.

Figure 5B:
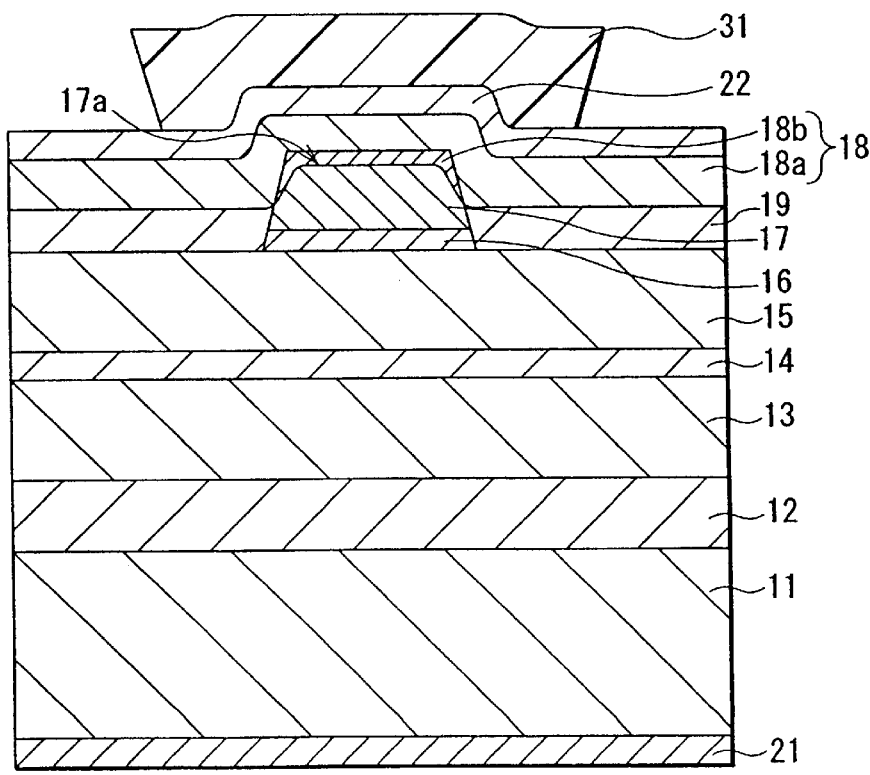

After forming the n-side electrode 21 and the p-side electrode 22, as shown in FIG. 5B, for example, a resist film 31 is applied on the p-side electrode 22, exposed by using a not-shown mask, and developed, thereby forming a predetermined pattern. By the operation, the projected portion 23 is covered with the resist film 31.

Figure 6:
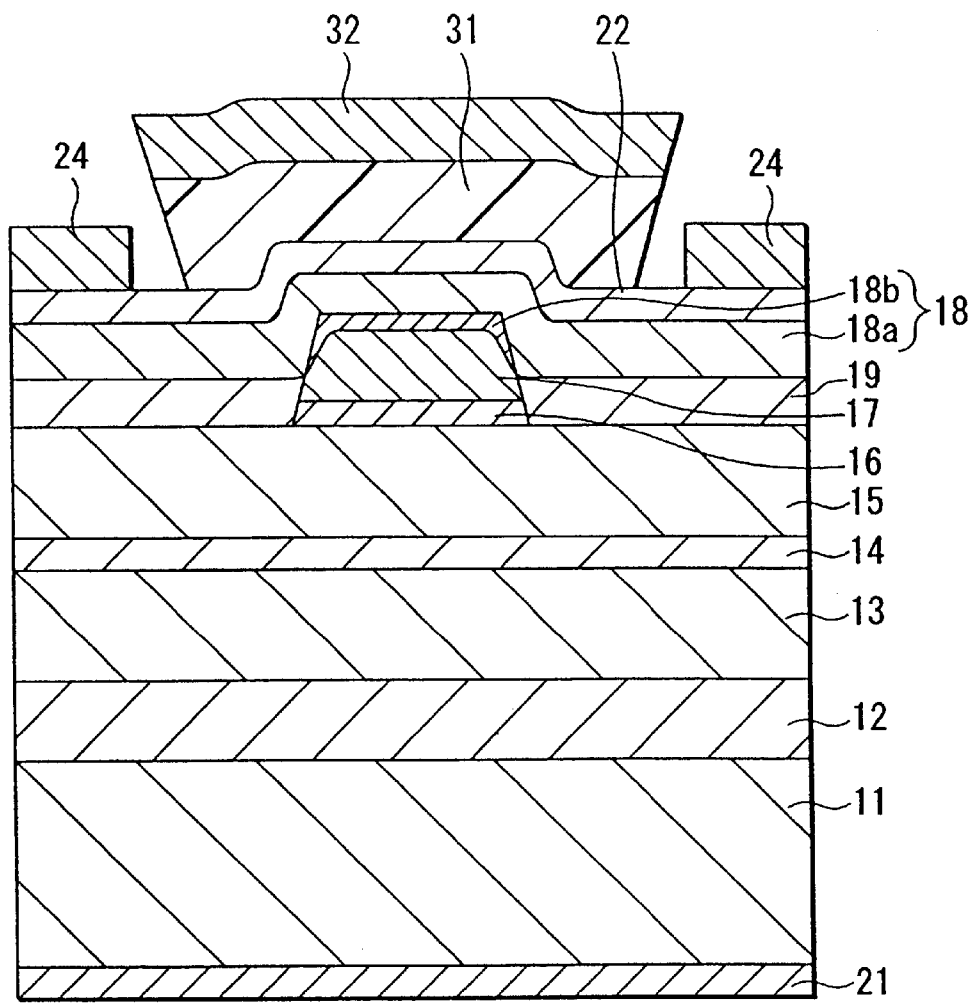
FIG. 6 is a cross section showing a manufacturing process continued from FIG. 5B.

After that, as shown in FIG. 6, on the p-side electrode 22, for example, the protective portion 24 made of a metal or insulating material is selectively formed by vapor deposition by using the resist film 31. At this time, the top face of the protective portion 24 is set to be either flush with or higher than that of the projected portion 23. After forming the protective portion 24, the resist film 31 is removed by, for example, an organic solvent and a deposited layer 32 deposited on the resist film 31 at the time of forming the protective portion 24 is simultaneously removed. After that, the substrate 11 is shaped in a predetermined size, and not-shown reflector films are formed on the pair of resonator end faces facing each other in the extending direction of the projected portion 17a. In such a manner, the semiconductor laser shown in FIG. 2 is formed.

The semiconductor laser acts as follows.

In the semiconductor laser, when a predetermined voltage is applied across the n-side electrode 21 and the p-side electrode 22, the current is limited by the projected portion 17a, the current is injected into the current injection area in the active layer 14, and light is generated by recombination of electrons and holes. The light is reflected between the not-illustrated pair of reflector films to thereby carry out laser oscillation, and the resultant is emitted as a laser beam to the outside. Since the protective portion 24 is formed in correspondence with the non-current injection area in the active layer 14 and the top face of the protective portion 24 is either flush with or higher than the projected portion 23, the number of times that a tool comes into contact with the projected portion 23 and its periphery is small at the time of manufacture, and the projected portion 23 and its periphery, for example, the projected portion 17a, current injection area in the active layer 14, and the like are prevented from being damaged. Thus, improved characteristics and improved quality are achieved.

According to the embodiment, on the surface opposite to the substrate 11 of the semiconductor laser, the protective portions 24 each having the top face flush with or higher than that of the projected portion 23 are formed. Consequently, the number of times that a tool comes into contact with the projected portion 23 and its periphery at the time of manufacture can be reduced. The projected portion 23 and its periphery, that is, projected portion 17a, current injection area in the active layer 14, and the like are prevented from being damaged. Thus, improved characteristics and improved quality are achieved. Moreover, improved appearance yield can be obtained.

[Second Embodiment]

Figure 7:
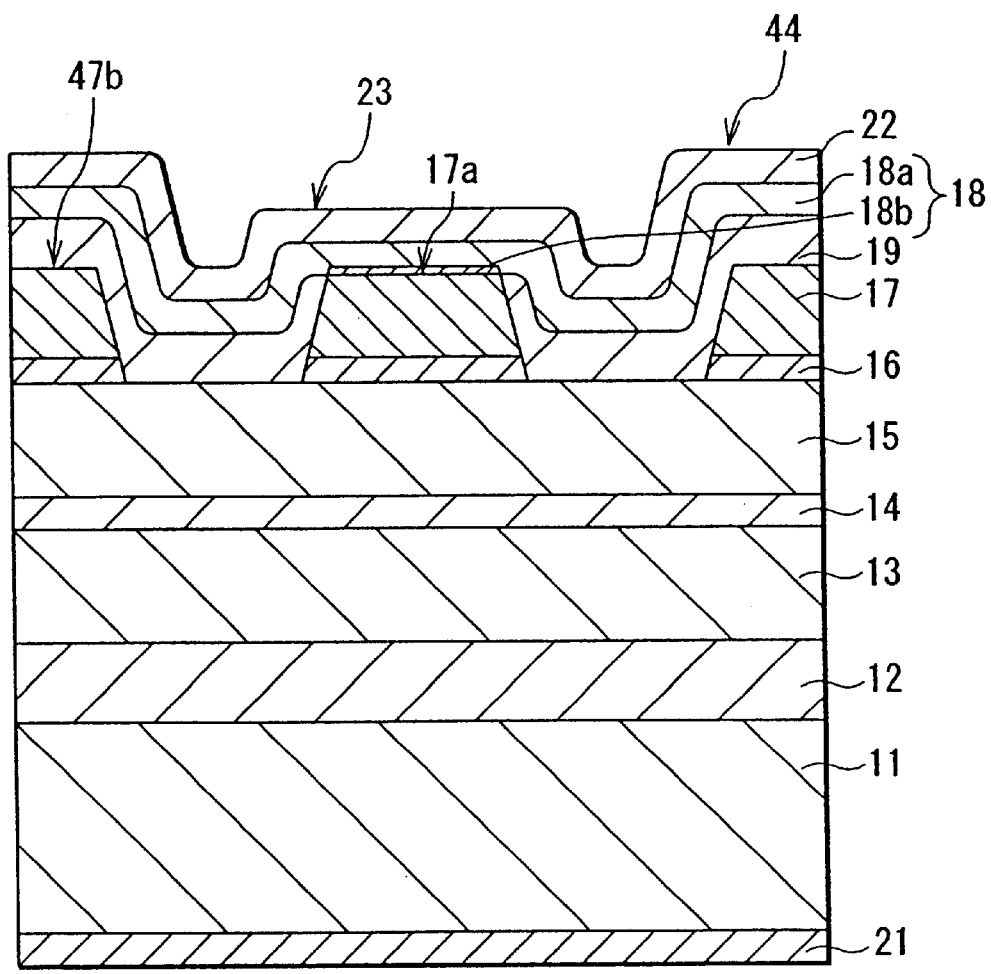
FIG. 7 is a cross section showing the configuration of a semiconductor laser according to a second embodiment of the invention.

FIG. 7 shows the configuration of a semiconductor laser according to a second embodiment of the invention. The semiconductor laser has the same configuration, action, and effects as those of the first embodiment except for the configuration of a protective portion 44. The same components as those of the first embodiment are designated by the same reference numerals and their detailed description will not be repeated here.

The semiconductor laser has projected portions 47b for protection formed by the second p-type cladding layer 17 and the etching stop layer 16 on both sides of the projected portion 17a via the current stop layer 19. The projected portions 47b are formed in correspondence with the non-current injection areas in the active layer 14 and extend, for example, in the same direction as the projected portion 17a. The current stop layer 19 is interposed between the projected portion 47b and the first diffusion area 18a in the p-side contact layer 18 to thereby prevent the passage of a current via the projected portion 47b.

The protective portion 44 is formed in correspondence with the projected portion 47b from a manufacture viewpoint. In the second embodiment, the p-side electrode 22 serves as the surface of the protective portion 44. Except for this, the protective portion 44 is the same as the protective portion 24 in the first embodiment.

The semiconductor laser having such a configuration can be manufactured as follows.

Figure 8A:
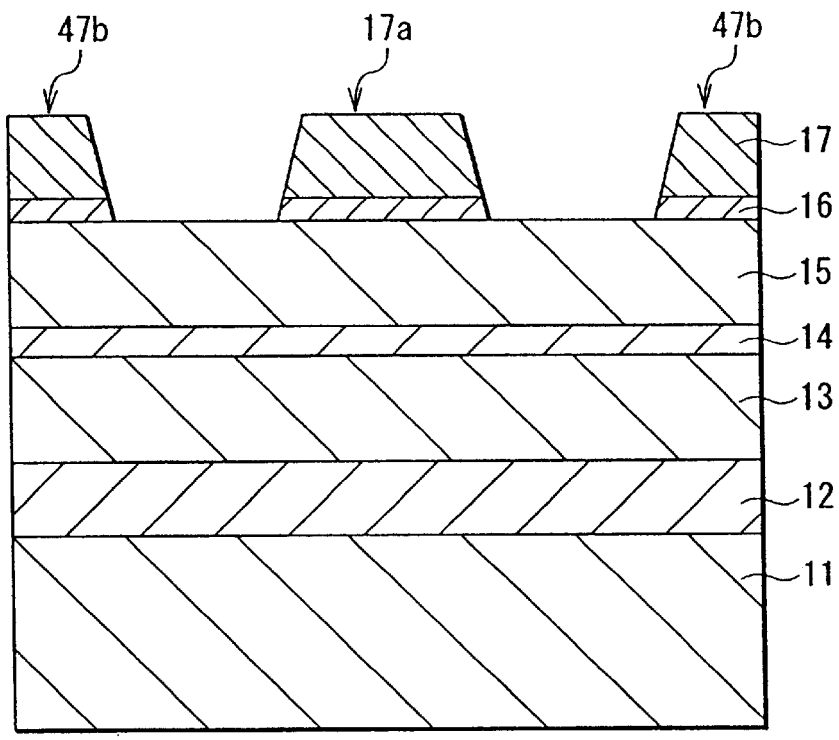
FIGS. 8A and 8B are cross sections showing a process of manufacturing the semiconductor laser illustrated in FIG. 7.

FIGS. 8A and 8B to FIG. 12 show a method of manufacturing the semiconductor laser according to the second embodiment in accordance with the order of processes. First, in a manner similar to the first embodiment, on one face of the substrate 11, the buffer layer 12, n-type cladding layer 13, active layer 14, first p-type cladding layer 15, etching stop layer 16, and second p-type cladding layer 17 are sequentially grown (refer to FIG. 3A). Subsequently, as shown in FIG. 8A, for example, the second p-type cladding layer 17 is selectively removed by using the etching stop layer 16 by RIE to thereby form the projected portion 17a and the projected portion 47b in the same process.

Figure 8B:
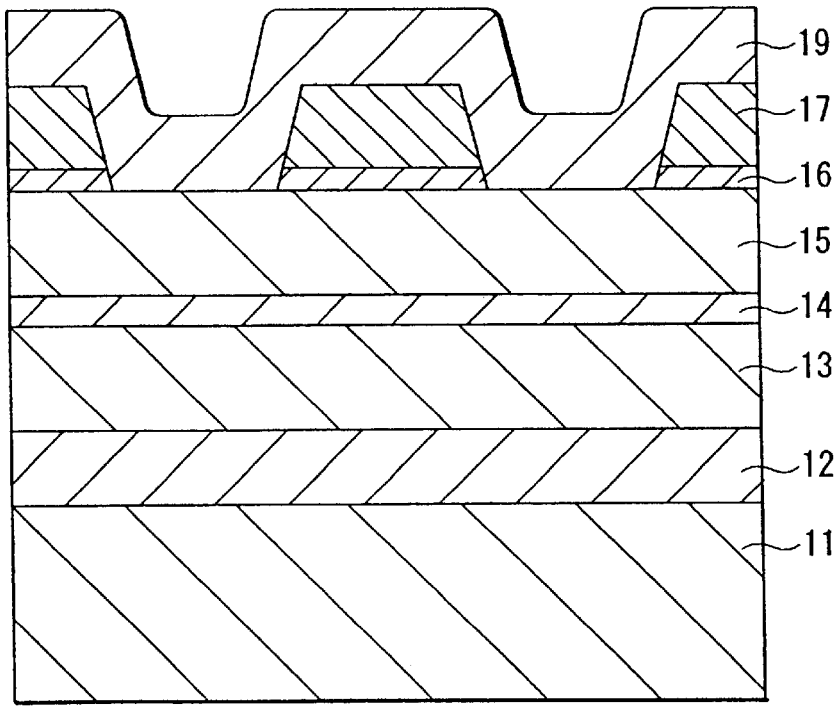
Figure 9:
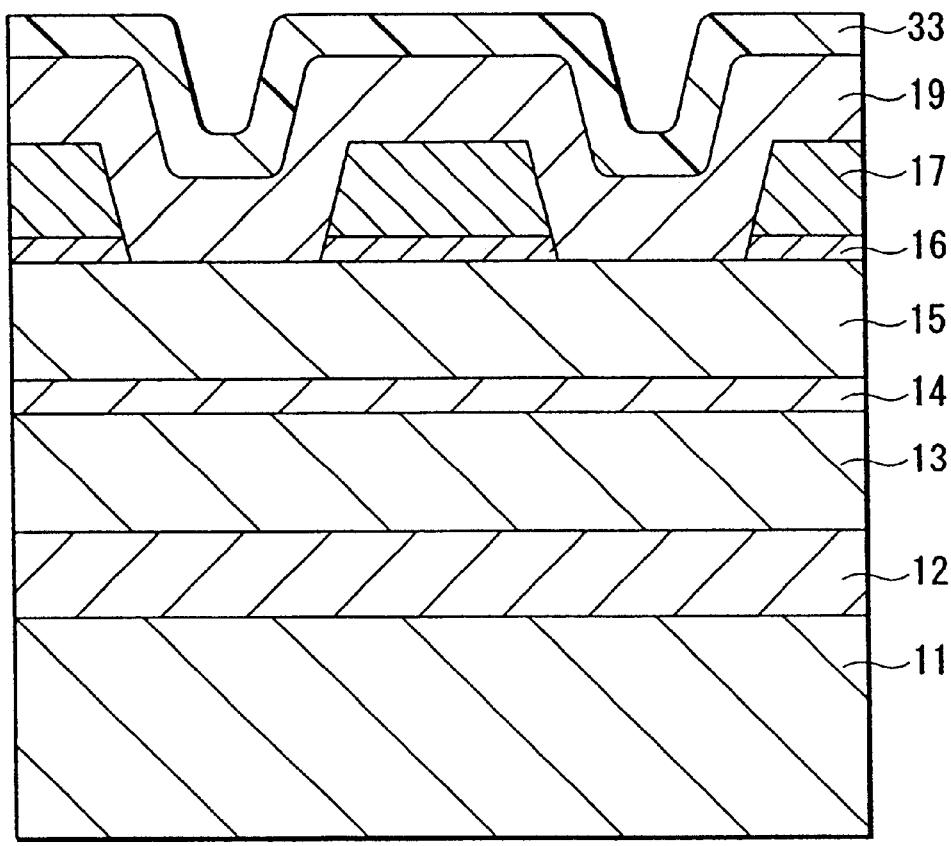
FIG. 9 is a cross section showing a manufacturing process continued from FIG. 8B.

Subsequently, as shown in FIG. 8B, for example, on the first p-type cladding layer 15, projected portion 17a, and projected portion 47b, in a manner similar to the first embodiment, the current stop layer 19 made of n-type GaAs is grown. In this case as well, in a manner similar to the first embodiment, the thickness of the current stop layer 19 to be grown is set to be a sufficient thickness also including the amount of forming the p-side contact layer 18 by diffusing a p-type impurity in a part of the current stop layer 19 in a process which will be described hereinlater. After growing the current stop layer 19, for example, as shown in FIG. 9, a resist film 33 is applied on the current stop layer 19.

Figure 10:
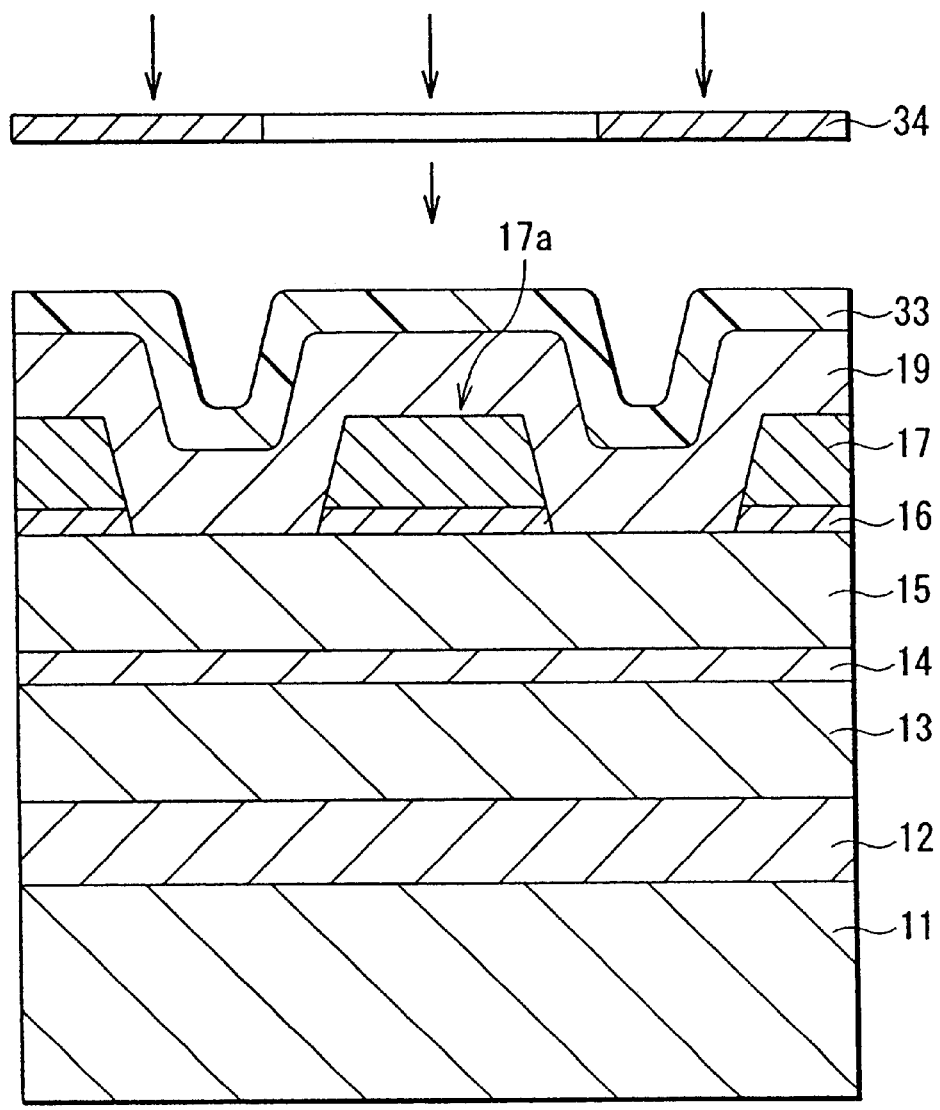
FIG. 10 is a cross section showing a manufacturing process continued from FIG. 9.
Figure 11A:
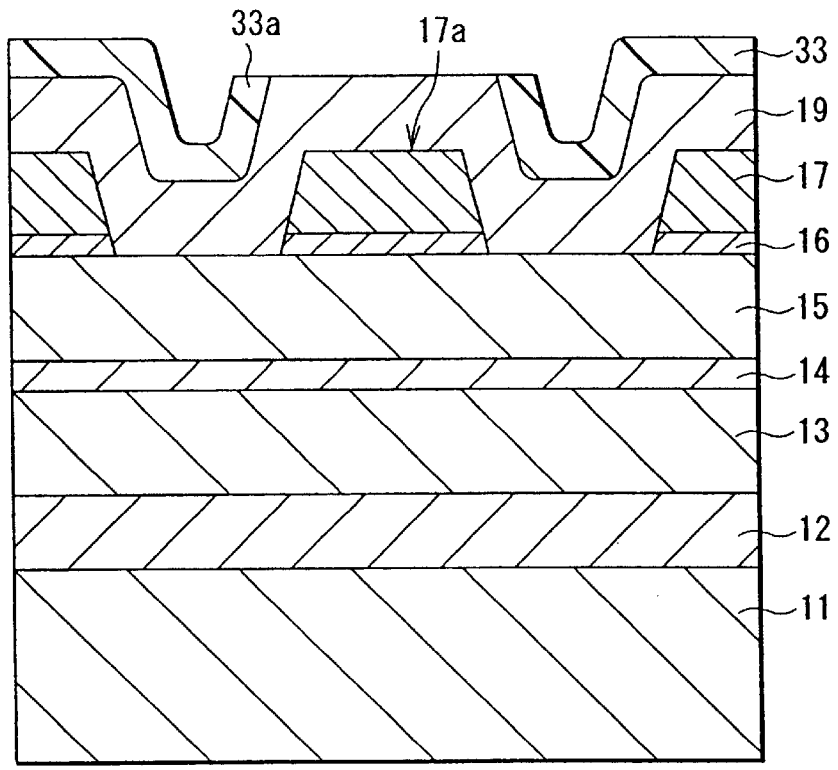
FIGS. 11A and 11B are cross sections showing a manufacturing process continued from FIG. 10.
Figure 11B:
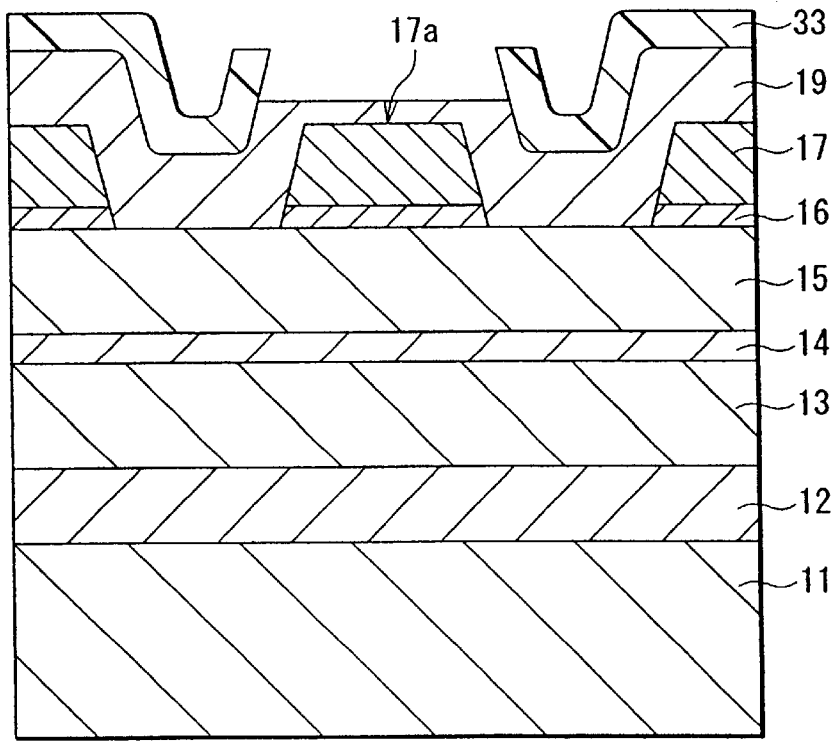

After that, for example, as shown in FIG. 10, by using a mask 34, the portion projected in correspondence with the projected portion 17a in the resist film 33 is selectively exposed and developed, thereby forming an opening 33a in the resist film 33 in correspondence with the projected portion 17a as shown in FIG. 11A. After forming the opening 33a in the resist film 33, as shown in FIG. 11B, for example, by using the resist film 33 as a mask, an upper part of the portion projected in correspondence with the projected portion 17a in the current stop layer 19 is selectively removed by RIE.

Figure 12:
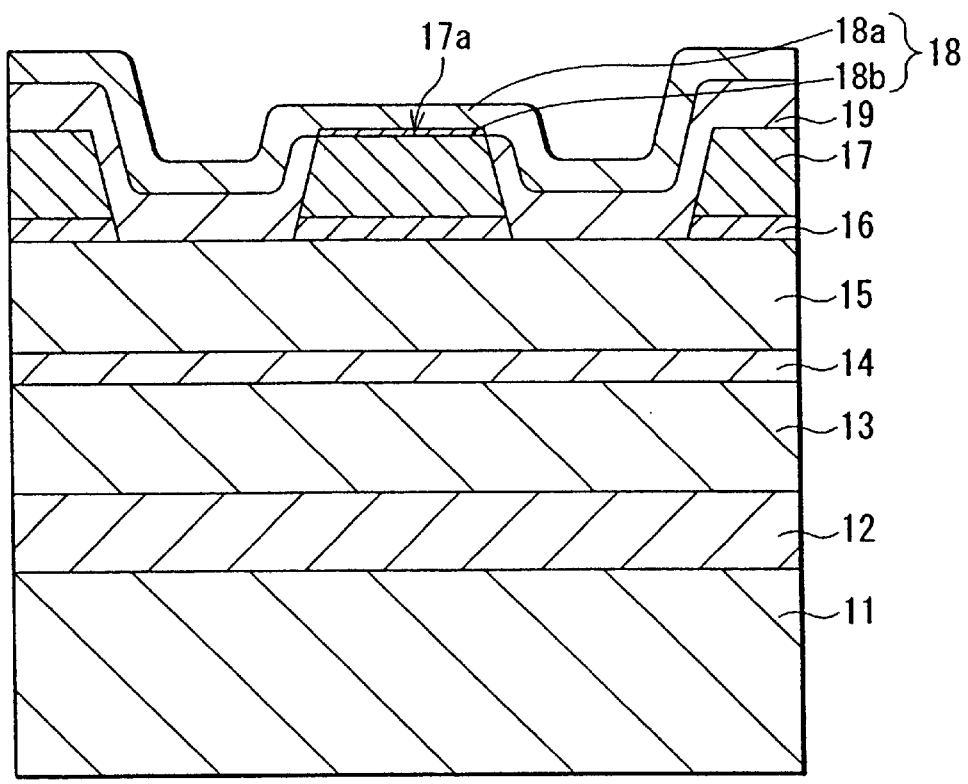
FIG. 12 is a cross section showing a manufacturing process continued from FIG. 11B.

After selectively removing the current stop layer 19, as show in FIG. 12, for example, a p-type impurity such as zinc is diffused in an upper part of the current stop layer 19 and in an upper part of the projected portion 17a. By the operation, the first diffusion area 18a of the p-side contact layer 18 is formed in the upper part of the current stop layer 19 and the second diffusion layer 18b of the p-side contact layer 18 is formed in the upper part of the projected portion 17a.

After forming the p-side contact layer 18, for example, in a manner similar to the first embodiment, the other face of the substrate 11 is lapped to form the n-side electrode 21, and the p-side electrode 22 is formed on the p-side contact layer 18. Since the projected portions are formed on the surface of the p-side contact layer 18 in correspondence with the projected portion 17a and the projected portion 47b, the projected portion 23 is formed on the surface of the p-side electrode 22 in correspondence with the projected portion 17a, and the projected protective portion 44 is formed in correspondence with the projected portion 47b. In the embodiment, as shown in FIG. 11B, the upper part of the current stop layer 19 is removed in correspondence with the projected portion 17a, so that the top face of the protective portion 44 is formed so as to be projected more than the projected portion 23.

After that, the substrate 11 is shaped in a predetermined size, and no-shown reflector films are formed on the pair of resonator end faces facing each other in the extending direction of the projected portion 17a. In such a manner, the semiconductor laser shown in FIG. 7 is formed.

[Third Embodiment]

Figure 13:
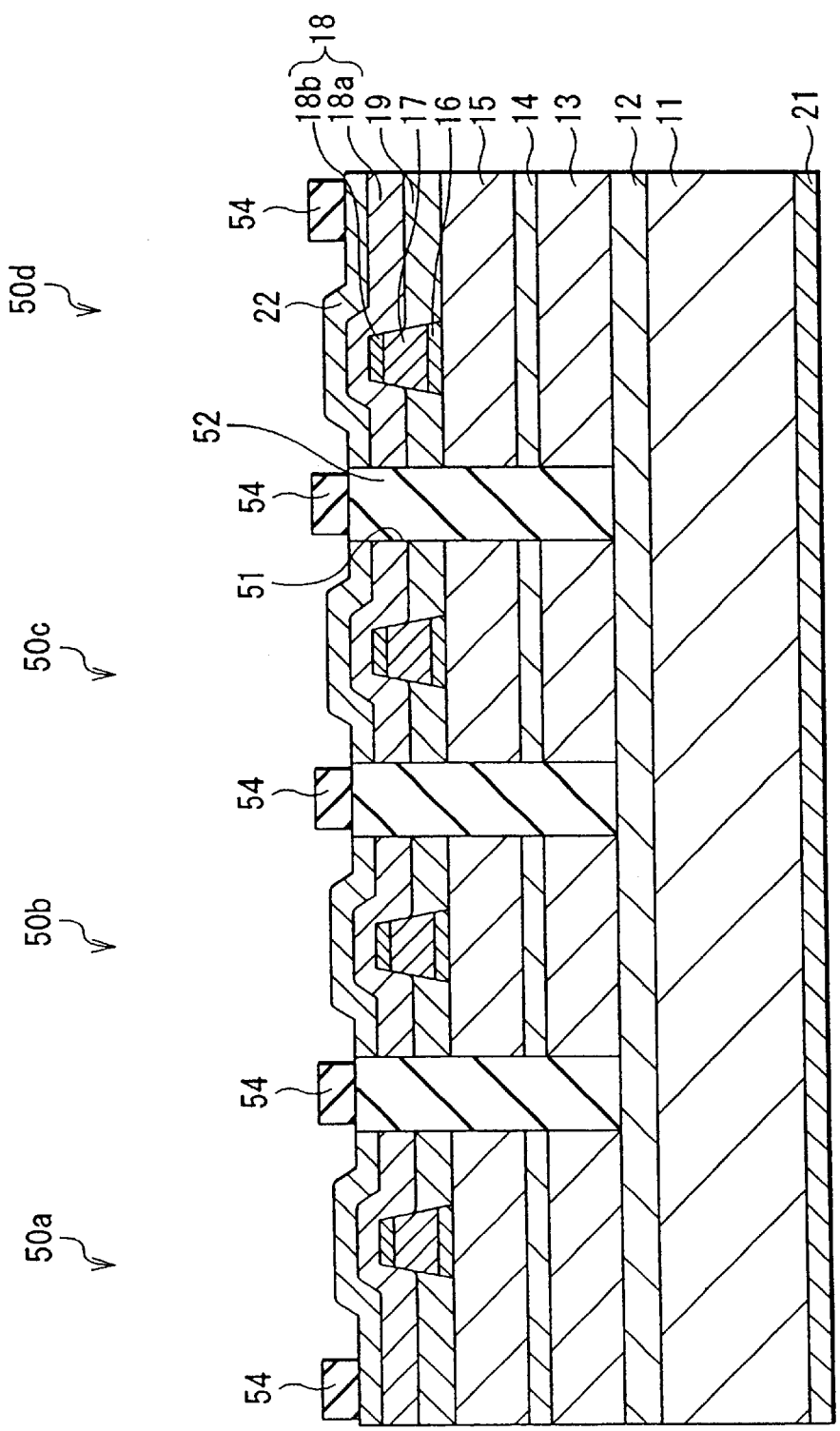
FIG. 13 is a cross section showing the configuration of a semiconductor laser according to a third embodiment of the invention.

FIG. 13 shows the configuration of a semiconductor laser according to a third embodiment of the invention. The semiconductor laser has a plurality of (four in this case) laser oscillating units 50*a*, 50*b*, 50*c*, and 50*d* arranged via isolation grooves 51 on the common substrate 11. Each of the laser oscillating units 50*a*, 50*b*, 50*c*, and 50*d* has substantially the same configuration as that of the semiconductor laser of the first embodiment except for a protective portion 54. Specifically, on one face side of the substrate 11, the buffer layer 12, n-type cladding layer 13, active layer 14, first p-type cladding layer 15, etching stop layer 16, second p-type cladding layer 17, and p-side contact layer 18 are stacked in this order, the second p-type cladding layer 17 is formed in a narrow strip shape which is the projected portion 17*a*, and the current stop layer 19 is formed on both sides of the projected portion 17*a*. On the other face side of the substrate 11, the n-side electrode 21 shared by the laser oscillating units 50*a*, 50*b*, 50*c*, and 50*d* is formed. On the p-side contact layer 18, the p-side electrode 22 is formed for each of the laser oscillation units 50*a*, 50*b*, 50*c*, and 50*d*. The same components as those of the first embodiment are designated by the same reference numerals and their detailed description will not be repeated.

In each isolation groove 51, a buried layer 52 made of, for example, an insulating material is formed. The protective portion 54 made of, for example, an insulating material, is formed on the buried layer 52. On the surface of the p-side electrode 22 of each of the laser oscillating units 50*a* and 50*d* positioned on both ends, the protective portion 54 is formed in correspondence with the non-current injection area on the outer side of the active layer 14. The protective portion 54 is not limited to the non-current injection area but may be provided in correspondence with an area other than the current injection area in the active layer 14. The other configuration of the protective portion 54 is the same as that of the protective portion 24 in the first embodiment. The protective portion 54 may be provided only on the buried layer 52.

The semiconductor laser having such a configuration can be manufactured in a manner similar to the first embodiment, similarly acts, and produces similar effects. Although the case where each of the laser oscillating units 50*a*, 50*b*, 50*c*, and 50*d* has the configuration substantially the same as that of the first embodiment has been described in the third embodiment, it is also possible to use, as the configuration of the laser oscillating unit, substantially the same configuration of the semiconductor laser of the second embodiment, and form the protective portion also on the isolation groove.

Figure 14:
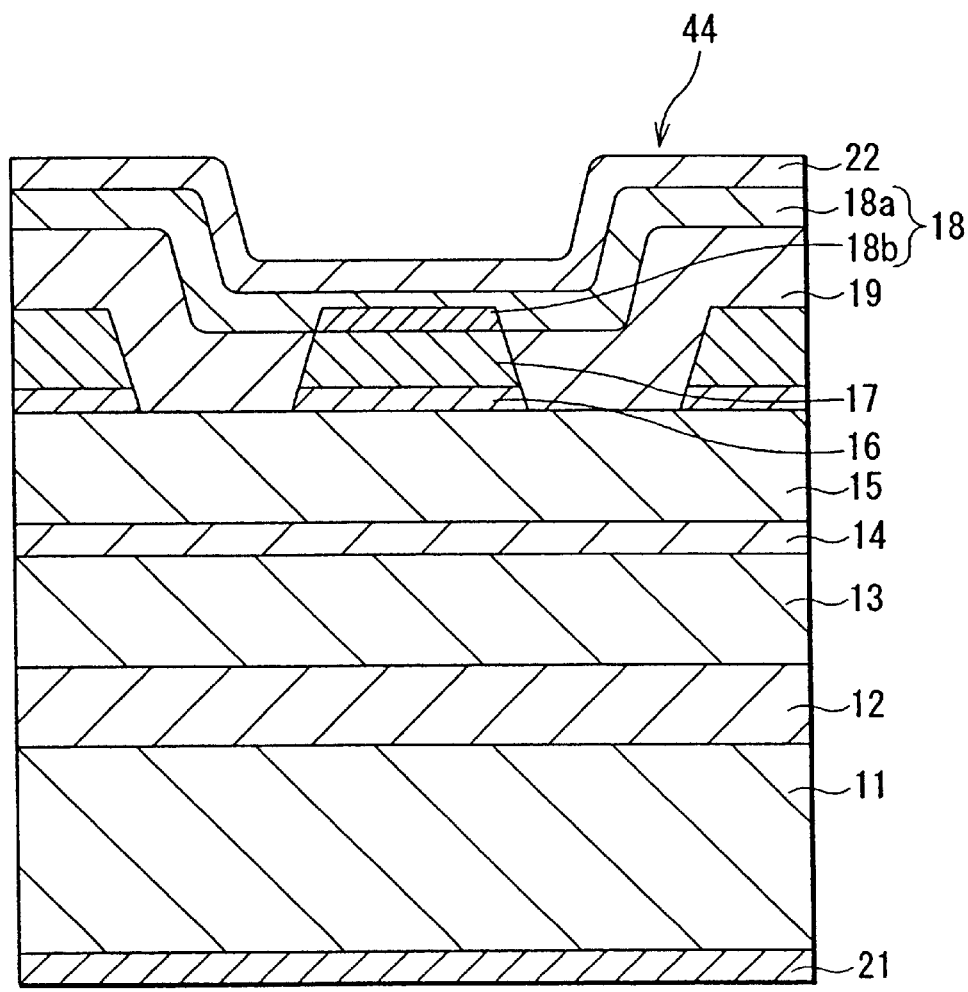
FIG. 14 is a cross section showing a modification of the invention.

Although the invention has been described by the embodiments, the invention is not limited to the foregoing embodiments but can be variously modified. For example, the case of providing the projected portion 23 on the surface of the p-side electrode 22, that is, on the surface opposite to the substrate 11 of the semiconductor laser in correspondence with the current injection area in the active layer 14 has been described in the embodiments. However, the projected portion 23 may not be always provided. For example, as shown in FIG. 14, there is a case such that the protective portion 44 is provided in a wide range and no projected portion is formed in the surface in correspondence with the projected portion 17*a*. In this case, by forming the semiconductor laser in such a manner that the top face of the protective portion 44 is flush with or higher than the area in the surface corresponding to the current injection area of the active layer 14, the same effects as those of the foregoing embodiments can be obtained.

Figure 15:
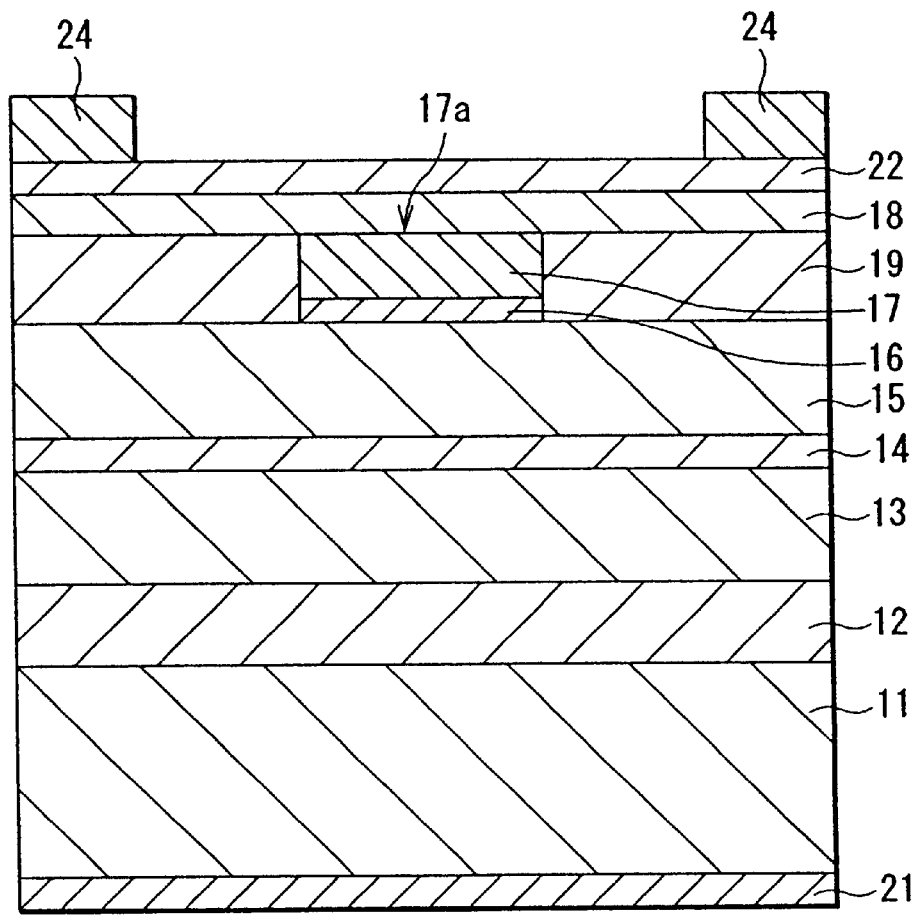
FIG. 15 is a cross section showing another modification of the invention.
Figure 16:
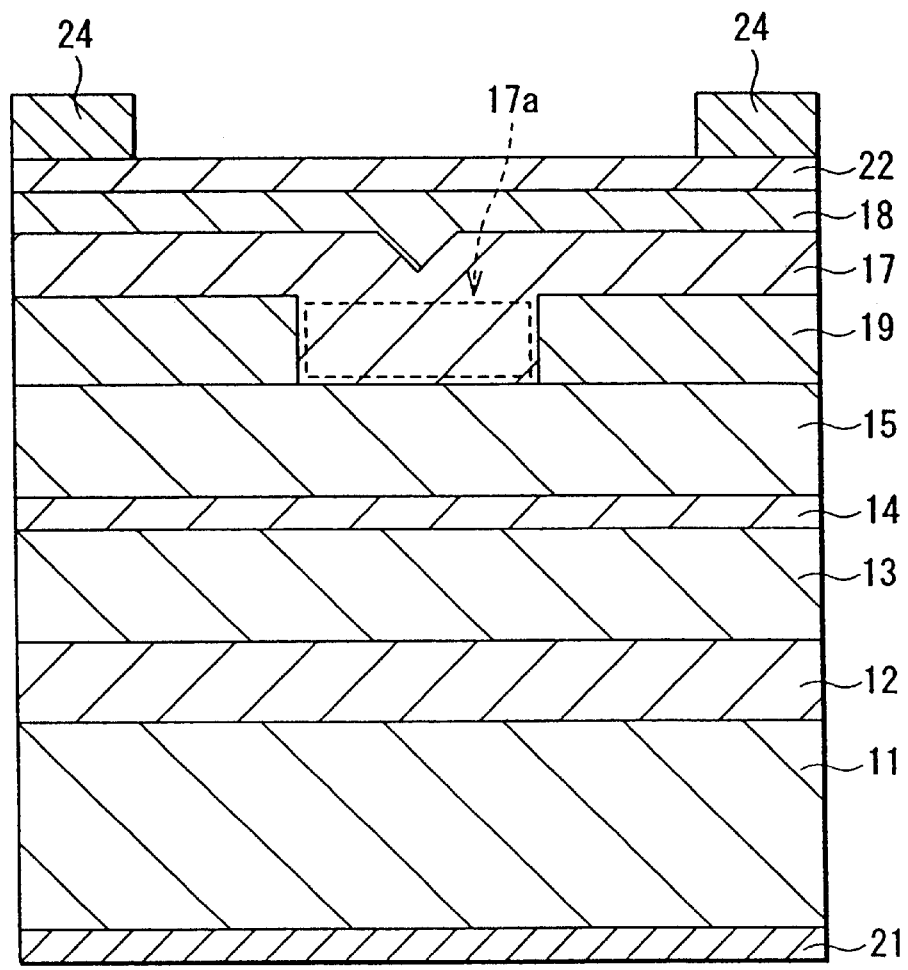
FIG. 16 is a cross section showing another modification of the invention.

For example, as shown in FIG. 15 or 16, there is a case that the projected portion is not formed on the surface in correspondence with the projected portion 17*a* according to the structure of the light emitting device. The projected portion 17*a* may be projected on the side opposite to the substrate 11 of the semiconductor laser, from the flat face of the substrate 11 and a p-type semiconductor layer (flat face of the first p-type cladding layer 15 in FIGS. 15 and 16). In this case as well, by making the top face of the protective portion 24 flush with or higher than the area in the surface corresponding to the current injection area in the active layer 14, effects similar to those of the foregoing embodiments can be obtained and the reliability can be increased.

Further, in the foregoing embodiments, the cases where the protective portions 24 and 44 extend in the same direction as the projected portion 23 and are provided on both sides of the projected portion 23 have been described. The protective portion may be of any shape and may be provided only one of the sides of the projected portion 23.

In addition, in the foregoing embodiments, concrete examples of the configuration of the semiconductor laser have been described. The invention, however, can be similarly applied to semiconductor lasers having other structures. Although the case of using the n type as the first conduction type and using the p type as the second conduction type has been described in the foregoing embodiments, the invention can be similarly applied to a case where the p type is used as the first conduction type and the n type is used as the second conduction type.

Further, although concrete examples of the materials constructing the semiconductor laser have been described in the embodiments, the invention can be widely applied to cases of using other semiconductor materials such as III–V compound semiconductors, III–V nitride compound semiconductors, and II–VI compound semiconductors.

In addition, although the case where the semiconductor layers are grown by MOCVD has been described in the embodiments, they may be grown by other methods such as molecular beam epitaxy (MBE).

Further, although the semiconductor laser has been concretely described in the foregoing embodiments, the invention can be also applied to other light emitting devices such as light emitting diode (LED). The invention can be also applied to a semiconductor device in which semiconductor layers are stacked on a substrate and a projected portion is formed on the surface opposite to the substrate of the device. For example, by providing a protective portion projected so that its top face is flush with or higher than the top face of the projected portion on the surface opposite to the substrate of the device, effects similar to those of the foregoing embodiments can be obtained. Specifically, when a projected portion is formed by a gate electrode on the surface opposite to the substrate in an FET (Field Effect Transistor) such as HEMT (High Electron Mobility Transistor), a protective portion projected so that its top face is flush with or higher than the top face of the gate electrode may be provided so as to sandwich the gate electrode.

In the light emitting device and the method of manufacturing the same according to the invention as described above, on the surface opposite to the substrate of the device, the protective portion projected so that its top face is flush with or higher than that of the projected portion is provided, or the protective portion projected so that its top face is flush with or higher than that of an area in the surface corresponding to the current injection area is provided. Consequently, the number of times a tool comes into contact with the projected portion and its periphery or the area in the surface corresponding to the current injection area and its periphery at the time of manufacture can be reduced. Thus, the projected portion and its periphery or the area in the surface corresponding to the current injection area and its periphery and, particularly, the current injection area can be prevented from being damaged. Consequently, improved characteristics and improved quality can be achieved. The appearance yield can be also improved.

In the semiconductor device and the method of manufacturing the semiconductor device according to the invention, the protective portion projected so that its top face is flush with or higher than that of the projected portion is provided on the surface opposite to the substrate of the device. Consequently, the number of times a tool comes into contact with the projected portion and its periphery can be reduced. Thus, the projected portion and its periphery can be prevented from being damaged. When the projected portion and its periphery relate to the characteristics, particularly improved characteristics can be achieved. Also, the appearance yield can be also improved.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a light emitting device, the method comprising the steps of:

growing semiconductor layers including an active layer on a substrate;

forming a projected portion for limiting current in correspondence with a current injection area of the active layer, thereby forming the projected portion for limiting current on a surface of the semiconductor layers opposite to the substrate; and forming a protective portion projected so that its top face is flush with or higher than that of the projected portion for limiting current on the surface opposite to the substrate in correspondence with an area other than the current injection area in the active layer, at least the top face of the projected portion for limiting current in correspondence with the current injection area remaining exposed.

2. A method of manufacturing a light emitting device according to claim 1, wherein the protective portion is made of one of a metal and an insulating material.

3. A method of manufacturing a light emitting device according to claim 1, further comprising the step of forming a second projected portion for protection on the semiconductor layers in correspondence with the area other than the current injection area in the active layer by a same process as that of the projected portion for limiting current.

4. A method of manufacturing a light emitting device, the method comprising the steps of:

growing semiconductor layers including an active layer on a substrate;

forming a projected portion for limiting current on the semiconductor layers in correspondence with a current injection area of the active layer; and forming a protective portion on a surface of the semiconductor layers opposite to the substrate in correspondence with an area other than the current injection area of the active layer so that a top face of the protective portion is flush with or higher than that of the projected portion for limiting current in the area corresponding to the current injection area, at least the top face of the projected portion for limiting current in correspondence with the current injection area remaining exposed.

* * * * *